US010249727B2

(12) United States Patent
Okamoto

(10) Patent No.: US 10,249,727 B2
(45) Date of Patent: Apr. 2, 2019

(54) SEMICONDUCTOR DEVICE WITH SILICON NITRIDE FILM OVER NITRIDE SEMICONDUCTOR LAYER AND BETWEEN ELECTRODES

(71) Applicant: RENESAS ELECTRONICS CORPORATION, Tokyo (JP)

(72) Inventor: Yasuhiro Okamoto, Ibaraki (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 15/670,982

(22) Filed: Aug. 7, 2017

(65) Prior Publication Data

US 2017/0358652 A1    Dec. 14, 2017

Related U.S. Application Data

(62) Division of application No. 14/961,545, filed on Dec. 7, 2015, now Pat. No. 9,761,682.

(30) Foreign Application Priority Data

Dec. 26, 2014    (JP) ................................. 2014-265569

(51) Int. Cl.
*H01L 29/423*   (2006.01)
*H01L 29/51*   (2006.01)
(Continued)

(52) U.S. Cl.
CPC ...... *H01L 29/42368* (2013.01); *H01L 29/511* (2013.01); *H01L 29/66462* (2013.01);
(Continued)

(58) Field of Classification Search
CPC ............ H01L 29/2003; H01L 29/4232; H01L 29/4238; H01L 29/41725; H01L 29/41758;
(Continued)

(56) References Cited

U.S. PATENT DOCUMENTS 5,381,028 A * 1/1995 Iwasa ................ H01L 29/66825
257/316
7,038,253 B2    5/2006 Yoshida et al.
(Continued)

FOREIGN PATENT DOCUMENTS

JP    2007-234986 A    9/2007
JP    2013-157396 A    8/2013
(Continued)

OTHER PUBLICATIONS

Non-final Office Action dated Oct. 14, 2016, issued in corresponding U.S. Appl. No. 14/961,545.
(Continued)

*Primary Examiner* — Scott B Geyer
(74) *Attorney, Agent, or Firm* — McDermott Will & Emery LLP

(57) ABSTRACT

In order to improve the characteristics of a semiconductor device including: a channel layer and a barrier layer formed above a substrate; and a gate electrode arranged over the barrier layer via a gate insulating film, the semiconductor device is configured as follows. A silicon nitride film is provided over the barrier layer between a source electrode and the gate electrode, and is also provided over the barrier layer between a drain electrode and the gate electrode GE. The surface potential of the barrier layer is reduced by the silicon nitride film, thereby allowing two-dimensional electron gas to be formed. Thus, by selectively forming two-dimensional electron gas only in a region where the silicon nitride film is formed, a normally-off operation can be performed even if a trench gate structure is not adopted.

9 Claims, 13 Drawing Sheets

(51) Int. Cl.
   *H01L 29/66*   (2006.01)
   *H01L 29/778*  (2006.01)
   *H01L 29/20*       (2006.01)
   *H01L 29/417*      (2006.01)

(52) U.S. Cl.
   CPC ...... *H01L 29/7786* (2013.01); *H01L 29/2003* (2013.01); *H01L 29/41758* (2013.01); *H01L 29/4238* (2013.01)

(58) Field of Classification Search
   CPC ........... H01L 29/66462; H01L 29/7786; H01L 29/66431; H01L 29/778–29/7789; H01L 2924/13064; H01L 29/122–29/127; H01L 29/15–29/158; H01L 29/42364; H01L 29/42368
   See application file for complete search history.

(56) References Cited

U.S. PATENT DOCUMENTS

| | | | |
|---|---|---|---|
| 7,547,911 | B2 | 6/2009 | Higashiwaki |
| 8,525,274 | B2 | 9/2013 | Takada |
| 8,809,138 | B2 | 8/2014 | Derluyn et al. |
| 8,900,939 | B2 | 12/2014 | Kub et al. |
| 2005/0023555 | A1* | 2/2005 | Yoshida ............ H01L 29/66462 257/192 |
| 2007/0018199 | A1 | 1/2007 | Sheppard et al. |
| 2007/0158692 | A1* | 7/2007 | Nakayama .......... H01L 29/4236 257/213 |
| 2008/0135880 | A1 | 6/2008 | Yoshida et al. |
| 2010/0140664 | A1 | 6/2010 | Sheppard et al. |
| 2011/0006346 | A1 | 1/2011 | Ando et al. |
| 2011/0263102 | A1 | 10/2011 | Heikman et al. |
| 2012/0056191 | A1* | 3/2012 | Endo ................. H01L 21/30612 257/76 |
| 2012/0139084 | A1 | 6/2012 | Hagleitner et al. |
| 2012/0146046 | A1* | 6/2012 | Ohki ................... H01L 29/4236 257/76 |
| 2012/0280280 | A1* | 11/2012 | Zhang ................ H01L 29/7786 257/194 |
| 2013/0037868 | A1 | 2/2013 | Okamoto et al. |
| 2013/0256694 | A1* | 10/2013 | Briere ................ H01L 29/4232 257/76 |
| 2014/0084300 | A1* | 3/2014 | Okamoto ............ H01L 29/2003 257/76 |
| 2014/0094223 | A1 | 4/2014 | Dasgupta et al. |
| 2014/0183598 | A1* | 7/2014 | Chiu ................. H01L 29/42364 257/190 |
| 2014/0239309 | A1 | 8/2014 | Ramdani et al. |
| 2014/0264364 | A1 | 9/2014 | Kanamura |
| 2014/0264454 | A1 | 9/2014 | Banerjee et al. |
| 2014/0346525 | A1* | 11/2014 | Minoura ............ H01L 29/4236 257/76 |
| 2015/0044825 | A1* | 2/2015 | Kanamura .......... H01L 21/0217 438/142 |
| 2015/0076510 | A1* | 3/2015 | Ramdani ........... H01L 29/66462 257/76 |
| 2015/0123143 | A1* | 5/2015 | Yumoto ............. H01L 29/66462 257/76 |
| 2015/0144955 | A1* | 5/2015 | Cheng ................. H01L 29/402 257/76 |
| 2015/0155358 | A1 | 6/2015 | Briere |
| 2015/0270355 | A1 | 9/2015 | Kuraguchi et al. |
| 2015/0303291 | A1* | 10/2015 | Makiyama .......... H01L 29/2003 257/76 |
| 2015/0325679 | A1 | 11/2015 | Wong et al. |

FOREIGN PATENT DOCUMENTS

| | | |
|---|---|---|
| JP | 2014-183125 A | 9/2014 |
| WO | 2006022453 A1 | 3/2006 |

OTHER PUBLICATIONS

Notice of Allowance dated May 5, 2017, issued in corresponding U.S. Appl. No. 14/961,545.

Japanese Office Action issued in corresponding Japanese Patent Application No. 2014-265569, dated Dec. 26, 2017, with English Translation.

Japanese Office Action issued in corresponding Japanese Patent Application No. 2014-265569, dated Apr. 24, 2018, with English Translation.

* cited by examiner

SEMICONDUCTOR DEVICE WITH SILICON NITRIDE FILM OVER NITRIDE SEMICONDUCTOR LAYER AND BETWEEN ELECTRODES

CROSS-REFERENCE TO RELATED APPLICATIONS

This application is a Divisional of U.S. patent application Ser. No. 14/961,545, filed Dec. 7, 2015, and claims priority of Japanese Patent Application No. 2014-265569 filed on Dec. 26, 2014, including the specification, drawings, and abstract is incorporated herein by reference in its entirety.

BACKGROUND ART

The present invention relates to a semiconductor device and a manufacturing method thereof, and can be preferably utilized in a semiconductor device using, for example, a nitride semiconductor.

In recent years, semiconductor devices, using a group III-V compound having a bandgap larger than that of silicon (Si), have been attracting attention. Among them, a MISFET using gallium nitride (GaN) has advantages that: 1) a breakdown electric field is large; 2) electron saturation velocity is large; 3) a thermal conductivity is large; 4) a good heterojunction can be formed between AlGaN and GaN; 5) the gallium nitride is non-toxic and highly safe; and the like.

For example, each of Patent Document 1 (Japanese Unexamined Patent Application Publication No. 2007-234986) and Patent Document 2 (International Publication No. 2006/022453) discloses a GaN-based field effect transistor having an AlN barrier layer. In the field effect transistor, an SiN insulating film is used as an insulating film for an element surface.

RELATED ART DOCUMENT

Patent Document

[Patent Document 1] Japanese Unexamined Patent Application Publication No. 2007-234986

[Patent Document 2] International Publication No. 2006/022453

SUMMARY

The present inventors are engaged in research and development of semiconductor devices using the aforementioned nitride semiconductor, and study hard to improve the characteristics thereof. In the course of the research and development, it has revealed that there is room for further improvement in the characteristics of a semiconductor device using a nitride semiconductor.

Other problems and new characteristics will become clear from the description and accompanying drawings of the present specification.

Of the preferred embodiments disclosed in the present application, outlines of the typical ones will be briefly described as follows.

A semiconductor device according to one embodiment disclosed in the present application includes: a first nitride semiconductor layer formed above a substrate; a second nitride semiconductor layer formed over the first nitride semiconductor layer; and a gate electrode arranged over the second nitride semiconductor layer via a gate insulating film. The semiconductor device further includes a first electrode and a second electrode formed above the second nitride semiconductor layer on both the sides of the gate electrode, respectively. The semiconductor device further includes: a first silicon nitride film formed over the second nitride semiconductor layer between the first electrode and the gate electrode; and a second silicon nitride film formed over the second nitride semiconductor layer between the second electrode and the gate electrode. The electron affinity of the first nitride semiconductor layer is larger than that of the second nitride semiconductor layer.

A manufacturing method of a semiconductor device according to one embodiment disclosed in the present application includes the steps of: (a) forming a first nitride semiconductor layer above a substrate; (b) forming a second nitride semiconductor layer over the first nitride semiconductor layer; and (c) forming a gate insulating film over a first region of the second nitride semiconductor layer. The manufacturing method of a semiconductor device further includes the steps of: (d) forming a silicon nitride film over the second nitride semiconductor layer and the gate insulating film; and (e) forming a gate electrode above the gate insulating film via a silicon nitride film. The manufacturing method of a semiconductor device further includes the step of: (f) forming both a first electrode above the second nitride semiconductor layer on one side of the gate electrode and a second electrode above the second nitride semiconductor layer on the other side of the gate electrode. The electron affinity of the first nitride semiconductor layer is larger than that of the second nitride semiconductor layer. Additionally, the sheet resistance of a laminated part of the first nitride semiconductor layer and the second nitride semiconductor layer, after the step (d), is lower than that of the laminated part of the first nitride semiconductor layer and the second nitride semiconductor layer, in the step (b).

In a semiconductor device according to a typical embodiment that is disclosed in the present application and described below, the characteristics of the semiconductor device can be improved.

In a manufacturing method of a semiconductor device according to a typical embodiment that is disclosed in the present application and described below, a semiconductor device having good characteristics can be manufactured.

DETAILED DESCRIPTION

Figure 1:
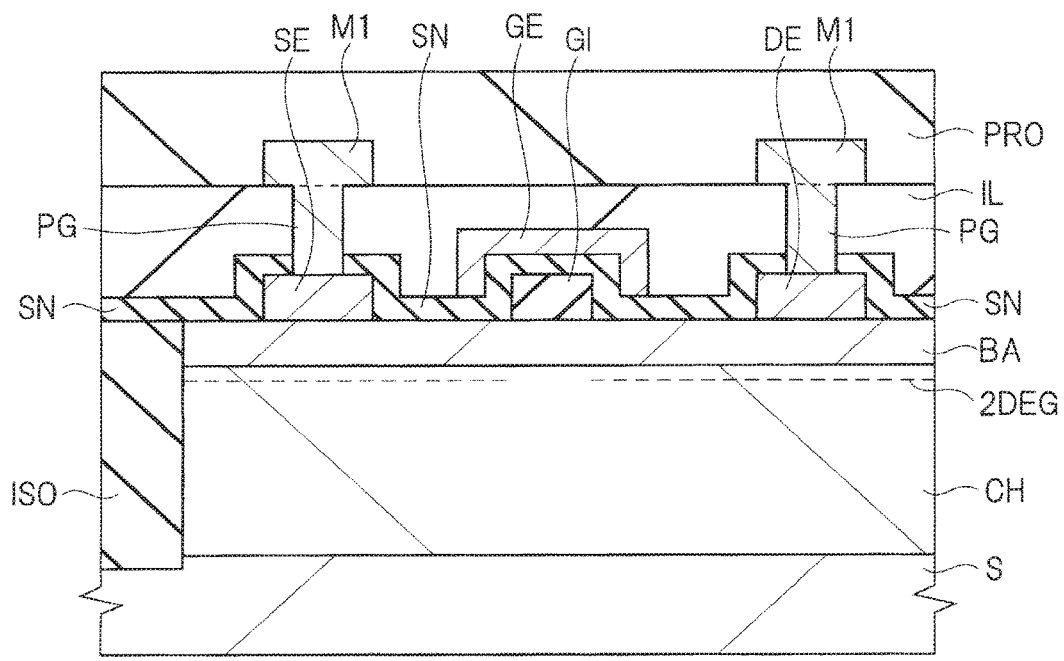
FIG. 1 is a sectional view illustrating a configuration of a semiconductor device according to First Embodiment.

If needed for convenience, the following embodiments will be described by dividing each of them into multiple sections or embodiments; however, the multiple sections or embodiments are not irrelevant to each other, but they are in a relationship in which one is a variation, application example, detailed description, or supplementary description of part or the whole of the others, unless otherwise indicated. When the numbers of elements, etc. (including numbers of pieces, numerical values, amounts, ranges, etc.) are referred to in the following embodiments, the numbers are not limited to the specific ones but may be more or less than the specific numbers, unless otherwise indicated or except when the numbers are obviously limited to the specific numbers in principle.

Further, in the following embodiments, the constituents (also including element steps, etc.) are not necessarily essential, unless otherwise indicated or clearly essential in principle. Similarly, when the shapes and positional relations, etc., of the constituents, etc., are referred to in the following embodiments, those substantially the same or similar to the shapes, etc., should also be included, unless otherwise indicated or except when considered to be clearly otherwise in principle. The same is true with the aforementioned numbers, etc., (including the numbers of pieces, numerical values, amounts, and ranges, etc.).

Hereinafter, preferred embodiments will be described in detail with reference to the accompanying views. In the whole views for explaining the embodiments, members having the same function as each other will be denoted with the same or relevant reference numeral and duplicative description will be omitted. When a plurality of similar members (parts) are present, an individual or specific part may be represented by adding a sign to the collective reference numeral. In the following embodiments, description of the same or similar parts will not be repeated in principle, unless particularly necessary.

In the views used in the embodiments, hatching may be omitted even in sectional views in order to make them easier to see. Alternatively, hatching may be added even in plan views in order to make them easier to see.

In a sectional view or a plan view, the size of each part does not correspond to that of an actual device, and a specific part may be displayed to be relatively large in order to make the view easier to understand. The same is true with the case where a sectional view and a plan view correspond to each other.

First Embodiment

Hereinafter, a semiconductor device according to the present embodiment will be described in detail with reference to the views.

[Structure Description]

FIG. 1 is a sectional view illustrating a configuration of the semiconductor device according to the present embodiment. The semiconductor device (semiconductor element) according to the embodiment illustrated in FIG. 1, etc., is an MIS (Metal Insulator Semiconductor) type field effect transistor (FET) using a nitride semiconductor. This semiconductor device can be used as a high electron mobility transistor (HEMT) type power transistor.

In the semiconductor device according to the present embodiment, a channel layer (also referred to as an electron transit layer) CH and a barrier layer BA are formed in this order over a substrate S. The channel layer CH includes a nitride semiconductor layer. The barrier layer BA includes a nitride semiconductor layer having an electron affinity smaller than that of the channel layer CH.

A MISFET according to the present embodiment has: a gate electrode GE formed above the barrier layer BA via a gate insulating film GI; and a source electrode SE and a drain electrode DE that are formed over the barrier layer BA on both the sides of the gate electrode GE. This MISFET is formed in an active region (AC) partitioned by an element isolation region (ISO), as described later (see FIG. 2).

Herein, a silicon nitride film SN is formed over the barrier layer BA located between the gate electrode GE and the source electrode SE in the present embodiment. The silicon nitride film SN is also formed over the barrier layer BA located between the gate electrode GE and the drain electrode DE.

Additionally, two-dimensional electron gas 2DEG is generated below the contact region between the silicon nitride film SN and the barrier layer BA and on the channel layer CH side near the interface between the channel layer CH and the barrier layer BA, in the present embodiment. The silicon nitride film SN also extends between the gate insulating film GI and the gate electrode GE.

When a positive potential (threshold potential) is applied to the gate electrode GE, a channel is generated below the gate electrode GE (gate insulating film GI) and on the channel layer CH side near the interface between the channel layer CH and the barrier layer BA.

As described above, when a positive potential (threshold potential) is not applied to the gate electrode GE, the two-dimensional electron gas 2DEG is not formed below the gate electrode GE (gate insulating film GI) in the semiconductor device according to the present embodiment, and hence an OFF state can be maintained. When a positive potential (threshold potential) is applied to the gate electrode GE, the two-dimensional electron gas 2DEG is coupled via the generated channel, and hence an ON state can be maintained. Thus, a normally-off operation can be performed. In an ON state and an OFF state, the potential of the source electrode SE is, for example, a ground potential.

In the present embodiment, the barrier layer BA includes a nitride semiconductor layer having an electron affinity smaller than that of the channel layer CH, and when these semiconductor layers are simply contacted with each other, the concentration of the two-dimensional electron gas (2DEG) formed over the joint surface (hetero interface) between these layers is low, and hence electrical conduction cannot be achieved.

In general, when the channel layer CH including a nitride semiconductor layer and the barrier layer BA including a nitride semiconductor layer having an electron affinity smaller than that of the channel layer CH is contacted with each other, a square-well potential is generated over the joint surface between these semiconductor layers. The two-dimensional electron gas (2DEG) is generated near the interface between the channel layer CH and the barrier layer BA by storing electrons in the square-well potential.

In the present embodiment, however, the thickness of the barrier layer BA is small, and the concentration of the two-dimensional electron gas (2DEG) formed over the joint surface between these semiconductor layers is low. Also, by using a non-doped epitaxial layer as each of the barrier layer BA and the channel layer CH, the resistance of a laminated film of these layers becomes high, thereby allowing the electrical conduction between the source electrode SE and the drain electrode DE to be blocked. The sheet resistance (resistance between the source electrode SE and the drain electrode DE) of the joint surface, over which only a low concentration of the two-dimensional electron gas (2DEG) is generated, is 10 MΩ/sq. or higher, and more preferably 10 GΩ/sq. or higher. A sheet resistance can be determined by measuring a current flowing through a laminated part and a potential difference occurring at the time with the use of a four-point probe method. When the sheet resistance (resistance between the source electrode SE and the drain electrode DE) can be adjusted to be within the range, impurities may be introduced into the barrier layer BA and the channel layer CH. In order to achieve such a sheet resistance, for example, the thickness of the barrier layer BA is made small. A preferred thickness is changed depending on the AL composition of the barrier layer BA. When the barrier layer BA having, for example, an Al composition of 15% to 20% is used, the thickness of the layer BA should be 9 nm or less, and more preferably 5 nm or less. Alternatively, when the barrier layer BA having an Al composition of 20% to 30% is used, the thickness thereof should be 5 nm or less, and more preferably 3 nm or less. These examples are applied when GaN is used as the buffer layer, and when AlGaN is used, the difference between the Al composition of the buffer layer and that of the barrier layer should be within the aforementioned composition range. For example, when the Al composition of the buffer layer is 4% and that of the barrier layer is 20%, the difference of 16% is assumed to be the aforementioned Al composition. That is, the case where GaN is used as the buffer layer corresponds to the case where the Al composition of the buffer layer (GaN) is 0%.

On the other hand, the silicon nitride film SN is formed over the barrier layer BA located between the gate electrode GE and the source electrode SE and between the gate electrode GE and the drain electrode DE in the present embodiment. The surface potential of the barrier layer BA is reduced by the silicon nitride film SN, thereby allowing the two-dimensional electron gas (2DEG) to be formed. In other words, the concentration of the two-dimensional electron gas (2DEG) becomes high.

Thus, by selectively forming the two-dimensional electron gas (2DEG) only in the region where the silicon nitride film SN is formed, a normally-off operation can be achieved.

Subsequently, the detailed configuration of the semiconductor device according to the present embodiment will be described with reference to FIG. 1.

A semiconductor substrate including, for example, silicon (Si) can be used as the substrate S. Other than the silicon, a substrate including a nitride semiconductor, such as GaN, or a substrate including AlN, SiC, sapphire, or the like, may be used as the substrate S.

For example, a GaN layer can be used as the channel layer CH. Impurities are not intentionally doped into the channel layer CH. The thickness of the GaN layer is, for example, approximately 80 nm. Other than GaN, AlN, InN, or the like, can be used as a material for the channel layer CH. A mixed crystal of these nitride semiconductors may also be used. The non-doped channel layer CH is used in the present embodiment, but impurities may be appropriately doped in accordance with its application. As impurities to be doped, n-type impurities or p-type impurities can be used. Examples of the n-type impurities include, for example, Si, S, and Se, etc., and those of the p-type impurities include, for example, Be, C, and Mg, etc.

For example, an AlGaN layer can be used as the barrier layer BA. The thickness of the AlGaN layer is, for example, approximately 5 nm. The composition of the AlGaN layer is, for example, $Al_{0.2}Ga_{0.8}N$. Other than the AlGaN, an InAlN, or the like, can be used as a material for the barrier layer BA. Alternatively, a non-doped layer may be used as the barrier layer BA, and impurities may be appropriately doped in accordance with its application. As the impurities to be doped, n-type impurities or p-type impurities can be used. Examples of the n-type impurities include, for example, Si, S, and Se, etc., and those of the p-type impurities include, for example, Be, C, and Mg, etc.

As described above, a nitride semiconductor having an electron affinity smaller than that of the channel layer CH should be used as the barrier layer BA. However, if these semiconductor layers are simply contacted with each other, the concentration of the two-dimensional electron gas (2DEG) formed over the joint surface (hetero interface) between these layers is low.

The thickness of the silicon nitride film is, for example, approximately 100 nm. Other than the silicon nitride film (SiN), a silicon oxinitride film (SiON) may be used.

An aluminum oxide ($Al_2O_3$) film can be used as the gate insulating film GI. The thickness of the aluminum oxide film is, for example, approximately 50 nm. An insulating film, other than the aluminum oxide film, may be used as the gate insulating film GI. Other than the aluminum oxide film, for example, a silicon oxide ($SiO_2$) film, a hafnium oxide ($HfO_2$) film, or the like, may be used as the gate insulating film GI.

A titanium nitride (TiN) film can be used as the gate electrode GE. The thickness of the titanium nitride film is, for example, approximately 200 nm. A conductive film, other than the titanium nitride film, may be used as the gate electrode GE. For example, a polycrystalline silicon film, into which impurities, such as boron (B) or phosphorus (P), have been doped, may be used. Alternatively, a metal including Ti, Al, Ni, Au, or the like, may be used. Alternatively, a compound film (metal silicide film), made by both a metal including Ti, Al, Ni, Au, or the like, and Si, may be used. Alternatively, a nitride of a metal film including, Al, Ni, Au, or the like, may be used.

A laminated film made by a TiN film and an Al film located thereover can be used as the source electrode SE and the drain electrode DE. The thickness of the TiN film is, for example, approximately 50 nm, and that of the Al film is, for example, approximately 1000 nm. A material that can be in ohmic contact with the barrier layer BA may be used as a material for the source electrode SE and the drain electrode DE. A metal film including Ti, Al, Mo (molybdenum), Nb (niobium), V (vanadium), or the like, may be used as a material that forms the source electrode SE and the drain electrode DE.

An insulating film (interlayer insulating film) IL is arranged over the gate electrode GE, the source electrode SE, and the drain electrode DE. For example, a silicon oxide film can be used as the insulating film IL. The thickness of the silicon oxide film is, for example, approximately 2000 nm. Alternatively, an insulating film, other than the silicon oxide film, may be used. Alternatively, a laminated structure of several types of insulating films may be adopted. A contact hole is formed in the insulating film, and wiring M1, which is to be electrically coupled to a plug PG embedded in the contact hole, is formed over the insulating film IL. A protective film PRO is further formed over the wiring M1. An insulating film, such as a silicon oxynitride (SiON) film, can be used as the protective film.

Figure 2:
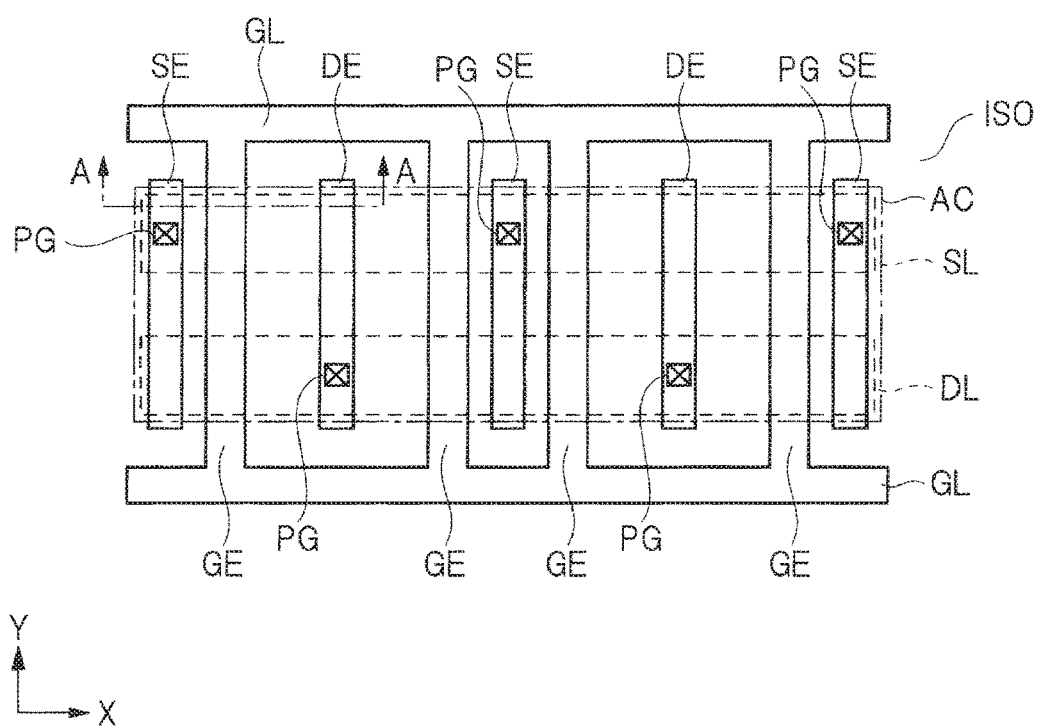
FIG. 2 is a plan view illustrating the configuration of the semiconductor device according to First Embodiment.

FIG. 2 is a plan view illustrating the configuration of the semiconductor device according to the present embodiment. For example, the gate electrode GE, the source electrode SE, and the drain electrode DE, which are illustrated in FIG. 1, correspond to the A-A section in FIG. 2.

The layout of the gate electrode GE, the source electrode SE, and the drain electrode DE is not limited, but these electrodes are arranged, for example, as illustrated in FIG. 2. Each of the source electrode SE and the drain electrode DE has, for example, a line shape extending in the Y direction. In other words, each of the electrodes has a rectangular shape (quadrangular shape) having long sides extending in the Y direction. The source electrode SE and the drain electrode DE are alternately arranged in the X direction. The gate electrode GE is arranged between the source electrode SE and the drain electrode DE. For example, one end (upper side in FIG. 2) of each of a plurality of the gate electrodes GE is coupled to a gate line GL extending in the X direction. The other end (lower side in FIG. 2) of each of the gate electrodes GE is coupled to another gate line GL extending in the X direction. Alternatively, one of the two gate lines GL may be omitted such that the whole shape of the gate electrodes GE and the gate line GL has a comb-like shape. Each of a plurality of the source electrodes SE is coupled to a source line SL extending in the X direction via a plug (coupling part) PG. Each of a plurality of the drain electrodes DE is coupled to a drain line DL extending in the X direction via another plug (coupling part) PG. Herein, the source electrode SE, the drain electrode DE, and the gate electrode GE are arranged mainly over an active region AC surrounded by an element isolation region ISO. The planar shape of the active region AC is a rectangular shape having long sides extending in the X direction. The active region AC is partitioned by being surrounded by the element isolation region ISO.

[Description of Manufacturing Method]

Subsequently, a manufacturing method of the semiconductor device according to the present embodiment will be described with reference to FIGS. 3 to 11, so that the configuration of the semiconductor device will be made clearer. FIGS. 3 to 11 are sectional views each illustrating a manufacturing step of the semiconductor device according to the embodiment.

Figure 3:
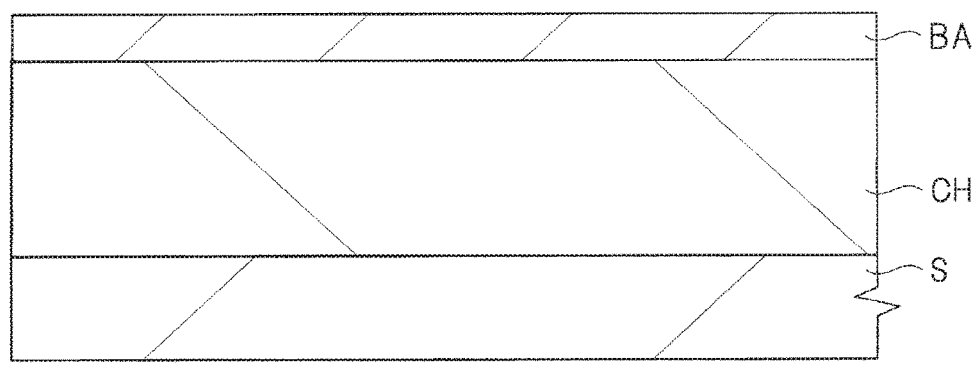
FIG. 3 is a sectional view illustrating a manufacturing step of the semiconductor device according to First Embodiment.

The channel layer CH is formed over the substrate S, as illustrated in FIG. 3. A semiconductor substrate including, for example, silicon (Si) whose (111) face is exposed is used as the substrate S, and a gallium nitride layer (GaN layer) is heteroepitaxially grown, as the channel layer CH, over the substrate S by using a Metal Organic Chemical Vapor Deposition (MOCVD) method, or the like. At the time, the gallium nitride layer is heteroepitaxially grown without intentional doping of impurities. The thickness of the channel layer CH is, for example, approximately 80 nm.

Alternatively, a substrate including SiC, sapphire, or the like, other than the silicon, may be used as the substrate S. All of the nitride semiconductor layers (group III-V compound semiconductor layers) to be formed over the substrate S are usually formed by group III element face growth (i.e., gallium face growth or aluminum face growth in this case).

Alternatively, a nucleation layer, a stress relaxation layer, and a buffer layer, etc., may be provided between the substrate S and the channel layer CH. These layers are formed, for example, as follows. For example, an aluminum nitride (AlN) layer is heteroepitaxially grown, as the nucleation layer, over the substrate S by using, for example, a metal organic chemical vapor deposition method, or the like. Subsequently, a superlattice structure, in which laminated films (AlN/GaN films) each being made of a gallium nitride (GaN) layer and an aluminum nitride (AlN) layer are repeatedly laminated, is formed, as the stress relaxation layer, over the nucleation layer. For example, gallium nitride (GaN) layers each having a thickness of approximately 20 nm and aluminum nitride (AlN) layers each having a thickness of 5 nm are alternately heteroepitaxially grown by using a metal organic chemical vapor deposition method, or the like. The aforementioned laminated films are formed, for example, into forty layers. For example, an AlGaN layer may subsequently be heteroepitaxially grown, as the buffer layer, over the stress relaxation layer by using a metal organic chemical vapor deposition method, or the like.

The nucleation layer is formed in order to produce a crystal nucleus when the layer to be formed thereover is grown. Additionally, the nucleation layer is formed in order to prevent deterioration of the substrate S, which may be generated with the constituent elements (e.g., Ga, etc.) of the layer to be formed thereover spreading from the layer to be formed thereover into the substrate S. Additionally, the stress relaxation layer is formed in order to suppress occurrence of a warp or a crack in the substrate S by relaxing the stress applied to the substrate S. Additionally, the buffer layer is formed in order to generate a negative polarization charge immediately below a channel such that a conduction band is lifted. Thereby, a threshold value can be increased.

Subsequently, for example, an AlGaN layer is heteroepitaxially grown to have a thickness of approximately 5 nm, as the barrier layer BA, over the channel layer CH by using a metal organic chemical vapor deposition method, or the like. For example, an $Al_{0.2}Ga_{0.8}N$ layer is formed by causing an Al composition ratio to be 0.2 and a Ga composition ratio to be 0.8. When the aforementioned AlGaN layer of the buffer layer is used, the Al composition ratio of the AlGaN layer of the barrier layer BA should be larger than that of the AlGaN layer of the buffer layer.

Thus, a laminated body (also referred to as a laminated part) of the channel layer CH and the barrier layer BA is formed. When the laminated body is formed, a low concentration of the two-dimensional electron gas (2DEG) is only generated near the interface between the channel layer CH and the barrier layer BA, as described above. The sheet resistance of the laminated body of the channel layer CH and the barrier layer BA, occurring at the time, is made R1. The sheet resistance R1 is 10 MΩ/sq. or higher.

Figure 4:
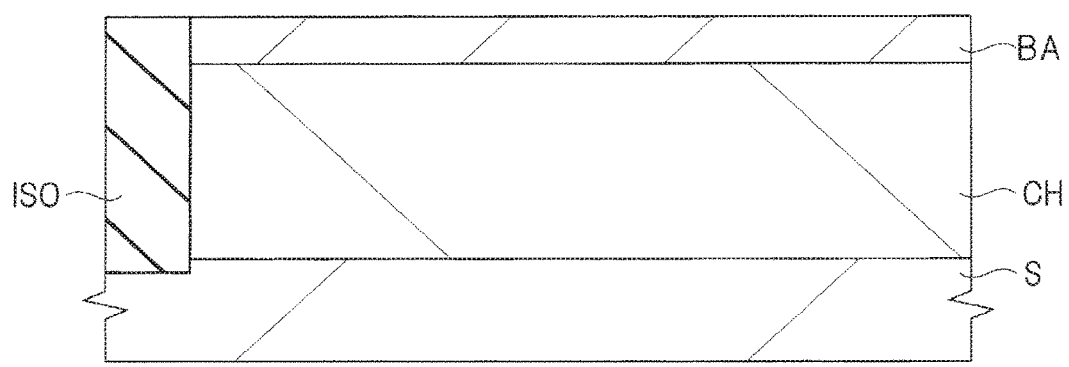
FIG. 4 is a sectional view illustrating a manufacturing step of the semiconductor device according to First Embodiment, the manufacturing step following FIG. 3.

Subsequently, the element isolation region ISO is formed, as illustrated in FIG. 4. For example, a photoresist film (not illustrated) having an opening in the element isolation region is formed over the barrier layer BA. Then, by doping nitrogen ions with the use of the photoresist film as a mask, the element isolation region ISO is formed. A crystal state is changed by thus doping ionic species, such as nitrogen (N) and boron (B), which increases the resistance.

For example, nitrogen ions are doped into the laminated body of the channel layer CH and the barrier layer BA so as to have a density of approximately $5 \times 10^{14}$ (5E14) $cm^{-2}$. The doping energy is, for example, approximately 120 keV. Herein, the depth of the doping, that is, the bottom of the element isolation region ISO is caused to be located at a position lower than the bottom of the channel layer CH by adjusting the conditions for doping nitrogen ions. The region surrounded by the element isolation region ISO will serve as the active region AC (see FIG. 2). As illustrated in FIG. 2, the active region AC has, for example, an approximately rectangular shape having long sides extending in the X direction. Thereafter, the photoresist film is removed.

Figure 5:
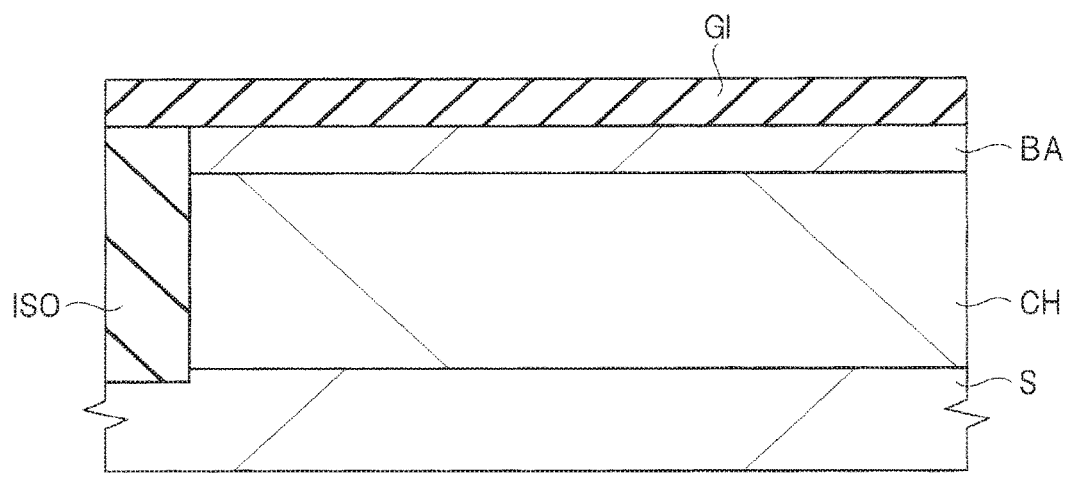
FIG. 5 is a sectional view illustrating a manufacturing step of the semiconductor device according to First Embodiment, the manufacturing step following FIG. 4.

Subsequently, the gate insulating film GI is formed over the barrier layer BA, as illustrated in FIG. 5. For example, an aluminum oxide film is deposited to have a thickness of approximately 50 nm, as the gate insulating film GI, over the barrier layer BA by using an ALD (Atomic Layer Deposition) method, or the like.

Other than an aluminum oxide film, a silicon oxide film and a high dielectric constant film having a dielectric constant higher than that of a silicon oxide film may be used as the gate insulating film GI. As the high dielectric constant film, a hafnium-based insulating film, such as a $HfO_2$ film (hafnium oxide film), hafnium aluminate film, HfON film (hafnium oxynitride film), HfSiO film (hafnium silicate film), HfSiON film (hafnium silicon oxynitride film), HfAlO film, or the like, may be used.

Figure 6:
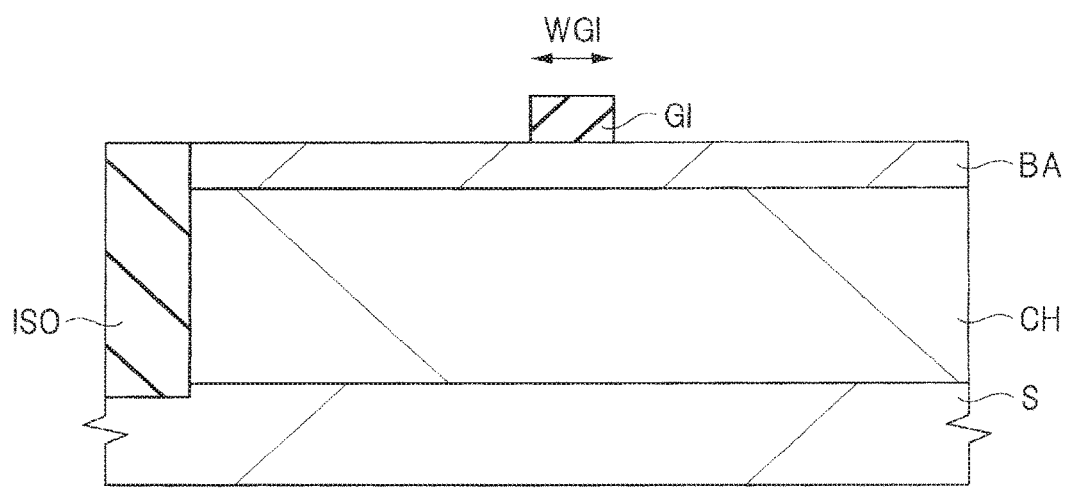
FIG. 6 is a sectional view illustrating a manufacturing step of the semiconductor device according to First Embodiment, the manufacturing step following FIG. 5.

Subsequently, the gate insulating film (aluminum oxide) GI is caused to remain only in a region where the gate electrode is to be formed, by etching the aluminum oxide, as illustrated in FIG. 6.

For example, a photoresist film (not illustrated) is formed over the gate insulating film GI, and is caused to remain only in the region where the gate electrode is to be formed by exposing and developing the photoresist film, thereby allowing the gate insulating film (aluminum oxide) GI to be etched with the use of the photoresist film as a mask. Herein, the step from the formation of the photoresist film to the removal thereof is referred to as "patterning".

In performing the etching, the gate insulating film GI is patterned, for example, into a line shape extending in a direction perpendicular to the plane of the paper (Y direction in FIG. 2). The width of the line is, for example, WGI. Thereby, the barrier layer BA is exposed on both the sides of the line-shaped gate insulating film GI.

Figure 7:
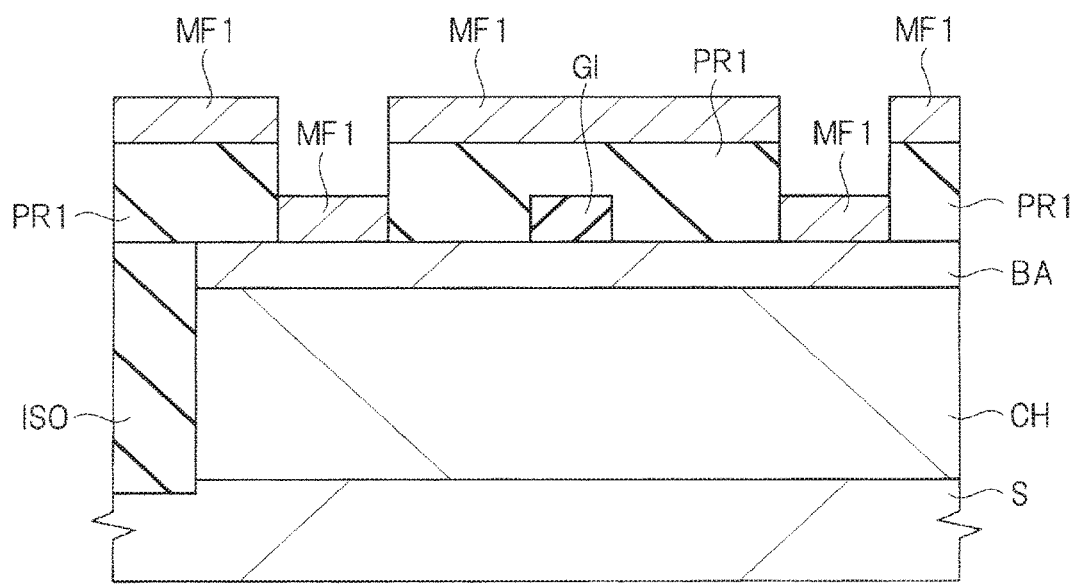
FIG. 7 is a sectional view illustrating a manufacturing step of the semiconductor device according to First Embodiment, the manufacturing step following FIG. 6.
Figure 8:
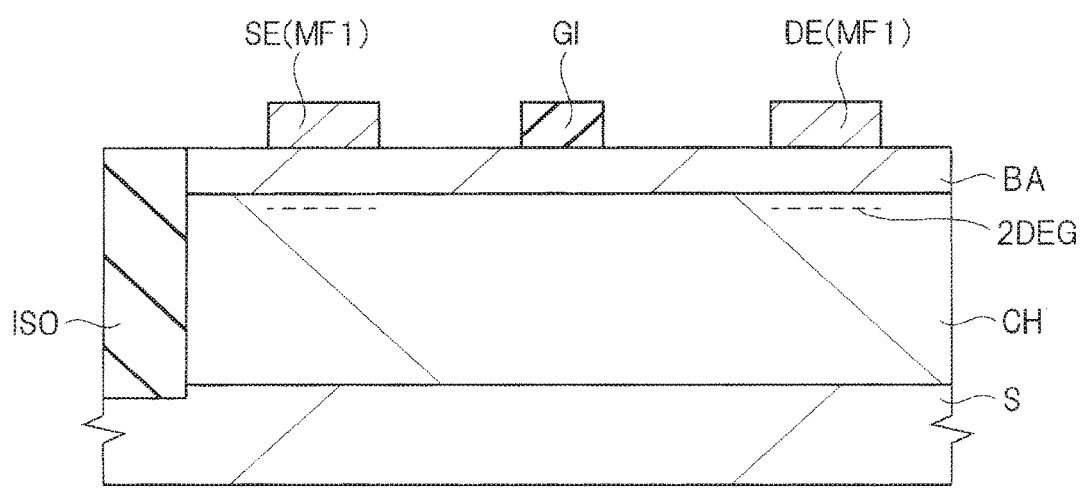
FIG. 8 is a sectional view illustrating a manufacturing step of the semiconductor device according to First Embodiment, the manufacturing step following FIG. 7.

Subsequently, the source electrode SE and the drain electrode DE are formed over the barrier layer BA on both the sides of the line-shaped gate insulating film GI, as illustrated in FIGS. 7 and 8. The source electrode SE and the drain electrode DE can be formed by using, for example, a liftoff method. A photoresist film PR1 is formed over the gate insulating film GI and the barrier layer BA, and then the photoresist film PR1 over the regions where the source electrode SE and the drain electrode DE are to be formed is removed by exposing and developing the photoresist film PR1, as illustrated in FIG. 7. The source electrode SE and the drain electrode DE may be formed by patterning.

Subsequently, a metal film MF1 is formed over the barrier layer BA including the photoresist film PR1. Thereby, the metal film MF1 is formed directly over the barrier layer BA in the regions where the source electrode SE and the drain electrode DE are to be formed. On the other hand, the metal film MF1 is formed over the photoresist film PR1 in other regions.

The metal film MF1 is formed, for example, by a laminated film (Ti/Al) of a titanium (Ti) film and an aluminum (Al) film formed thereover. Each of the films that form the metal film MF1 can be formed by using, for example, a vacuum deposition method.

Subsequently, the photoresist film PR1 is removed. At the time, the metal film MF1 formed over the photoresist film PR1 is also removed along with the photoresist film PR1, and the metal film MF1 formed over the barrier layer BA so as to be in direct contact therewith (the source electrode SE and the drain electrode DE) only remains (FIG. 8). Subsequently, the substrate S is subjected to a heat treatment (alloy treatment). The heat treatment is performed, for example, at 650° C. for approximately 30 seconds. An ohmic contact between the source electrode SE and the barrier layer BA can be achieved by the heat treatment. Similarly, an ohmic contact between the drain electrode DE and the barrier layer BA can be achieved. Thus, the surface potential of the substrate S (barrier layer BA) is reduced in the regions where the source electrode SE and the drain electrode DE, which are in ohmic contact, respectively, are formed, thereby allowing the two-dimensional electron gas 2DEG to be formed. In other words, the concentration of the two-dimensional electron gas 2DEG becomes high. The sheet resistance of the laminated body of the channel layer CH and the barrier layer BA, occurring at the time, is made R2. The sheet resistance R2 is 10 kΩ/sq. or lower.

Figure 9:
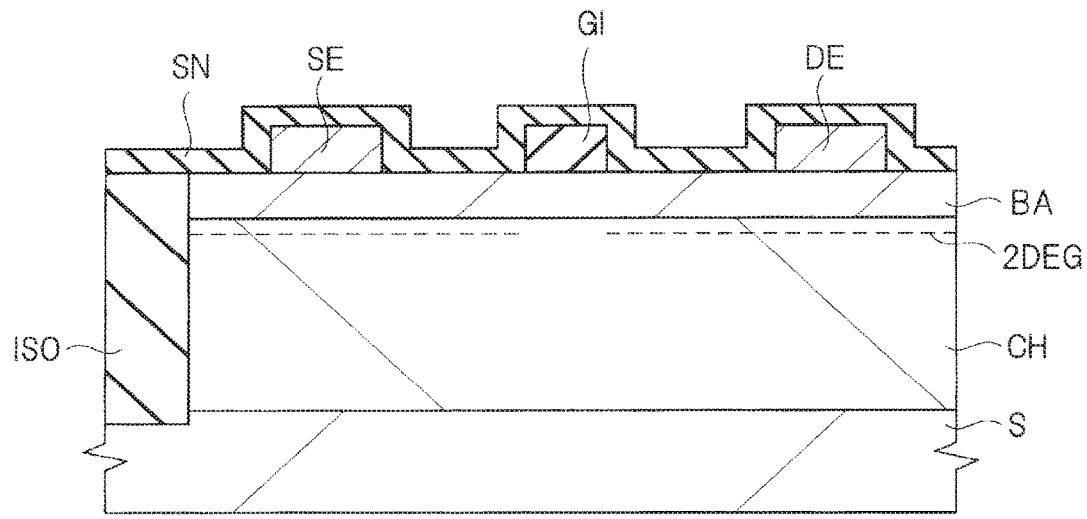
FIG. 9 is a sectional view illustrating a manufacturing step of the semiconductor device according to First Embodiment, the manufacturing step following FIG. 8.

Subsequently, the silicon nitride film SN is formed over the barrier layer BA including the source electrode SE, the drain electrode DE, and the gate insulating film GI, as illustrated in FIG. 9. The silicon nitride film is deposited to have a thickness of approximately 100 nm by using, for example, a CVD method, or the like.

Thereby, the barrier layers BA located between the gate electrode GE and the source electrode SE and between the gate electrode GE and the drain electrode DE are covered with the silicon nitride film SN. Thus, the surface potential of the barrier layer B is reduced in the barrier layer BA covered with the silicon nitride film SN, thereby allowing the two-dimensional electron gas 2DEG to be formed. In other words, the concentration of the two-dimensional electron gas 2DEG becomes high.

That is, the two-dimensional electron gas 2DEG is formed in the boundary between the barrier layer BA and the channel layer CH, the boundary being located in the active region (AC) other than a region where the gate insulating film GI is formed, as illustrated in FIG. 9.

Figure 10:
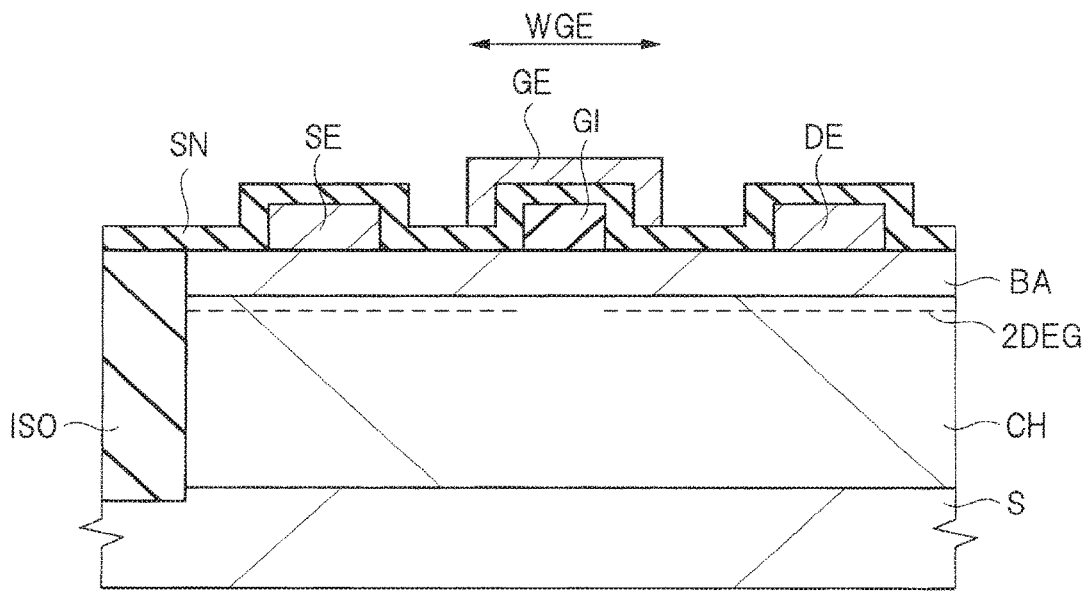
FIG. 10 is a sectional view illustrating a manufacturing step of the semiconductor device according to First Embodiment, the manufacturing step following FIG. 9.

Subsequently, the gate electrode GE is formed over the gate insulating film GI via the silicon nitride film SN, as illustrated in FIG. 10. For example, a TiN (titanium nitride) film is deposited to have a thickness of approximately 200 nm, as a conductive film, over the silicon nitride film SN by using, for example, a sputtering method, or the like. Subsequently, a photoresist film (not illustrated) is formed in the region where the gate electrode is formed by using a photolithography technique, and then the gate electrode GE is formed by etching the TiN film with the use of the photoresist film as a mask. The width of the gate electrode GE is, for example, WGE. The width WGE of the gate electrode GE is larger than the width WGI of the gate insulating film GI (WGE>WGI).

Figure 11:
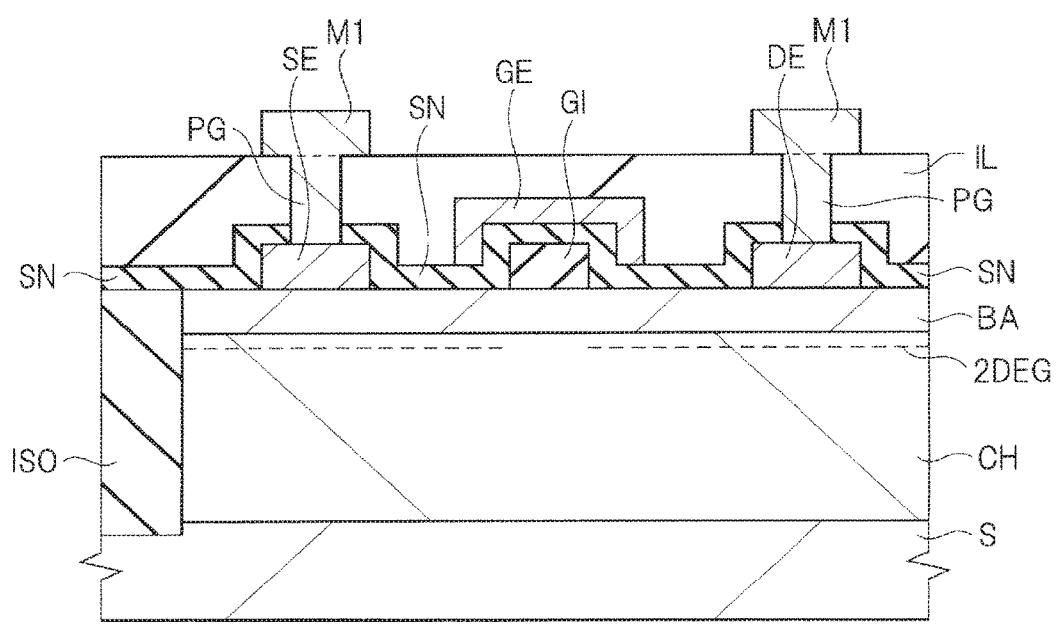
FIG. 11 is a sectional view illustrating a manufacturing step of the semiconductor device according to First Embodiment, the manufacturing step following FIG. 10.

Subsequently, for example, a silicon oxide film is deposited to have a thickness of approximately 2000 nm, as the insulating film IL, over the gate electrode GE and the silicon nitride film SN by using a CVD method, or the like, as illustrated in FIG. 11. Subsequently, a contact hole is formed in the insulating film IL and the silicon nitride film SN by using a photolithography technique and an etching technology. The contact hole is formed in each of the regions where the source electrode and the drain electrode are formed, respectively.

For example, a photoresist film (not illustrated), having an opening in each of the regions where the source electrode and the drain electrode are respectively coupled, is formed over the insulating film IL. Subsequently, the contact hole is formed by etching the insulating film IL and the silicon nitride film SN with the use of the photoresist film as a mask.

Subsequently, the plug (coupling part) PG and the wiring M1 are formed over each of the source electrode SE and the drain electrode DE that are located on both the sides of the gate electrode GE. For example, a conductive film is formed over the insulating film IL including the inside of the contact hole. The conductive film is formed by using, for example, a sputtering method, or the like, which is then patterned. Thereby, the plug (coupling part) PG, in which the conductive film is embedded in the contact hole, is formed and the wiring M1 is formed over the plug PG. The wiring M1 includes, for example, the aforementioned source line SL and drain wire DL.

Thereafter, a protective film (also referred to as an insulating film, cover film, or surface protective film) is formed over the insulating film IL. For example, a silicon oxynitride (SiON) film is deposited, as the protective film (not illustrated), over the insulating film IL by using a CVD method, or the like, (see FIG. 1).

With the aforementioned steps, the semiconductor device according to the present embodiment can be formed. The above steps are one example, and the semiconductor device according to the embodiment may be manufactured by the steps other than the above steps.

Since the silicon nitride film SN is thus formed over the barrier layer BA located between the gate electrode GE and the source electrode SE and between the gate electrode GE and the drain electrode DE in the present embodiment, the surface potential of the barrier layer BA is reduced by the silicon nitride film SN, thereby allowing the two-dimensional electron gas (2DEG) to be formed. On the other hand, the concentration of the two-dimensional electron gas (2DEG) below the gate insulating film GI is lower than those of the two-dimensional electron gas (2DEG) located between the gate electrode GE and the source electrode SE and between the gate electrode GE and the drain electrode DE. Thereby, conduction and non-conduction can be controlled below the gate insulating film GI by the presence/absence of a channel, that is, by a potential applied to the gate electrode GE. Further, in a conduction state, the resistances between the gate electrode GE and the source electrode SE and between the gate electrode GE and the drain electrode DE can be reduced by the two-dimensional electron gas (2DEG). Thus, a normally-off operation can be performed. Furthermore, gate leakage in an OFF state can be suppressed by causing the gate electrode to have a so-called MIS structure. Still furthermore, an operating voltage can be easily adjusted (designed) by controlling the thickness of the gate insulating film.

A normally-off operation can be performed by adopting, for example, a trench gate structure. Such a semiconductor device has a gate electrode arranged, via the gate insulating film, in a trench (also referred to as a recess) that penetrates the barrier layer and is dug to the middle of the channel layer. In this case, the two-dimensional electron gas (2DEG) is disconnected by the trench, and hence a normally-off operation can be performed.

In a semiconductor device having the trench gate structure, however, the trench is formed by etching a laminated film of the barrier layer and the channel layer. In such a case, a positive fixed charge is likely to be generated in the interface of an MIS structure part by the etching treatment, and hence a threshold potential may be decreased. On the other hand, it is not necessary to form a trench in the present embodiment, and hence an etching damage can be avoided in forming a trench and a threshold potential can be easily adjusted (designed).

Second Embodiment

In the present embodiment, the side surface (sidewall) of the gate insulating film GI has a tapered shape.

Figure 12A:
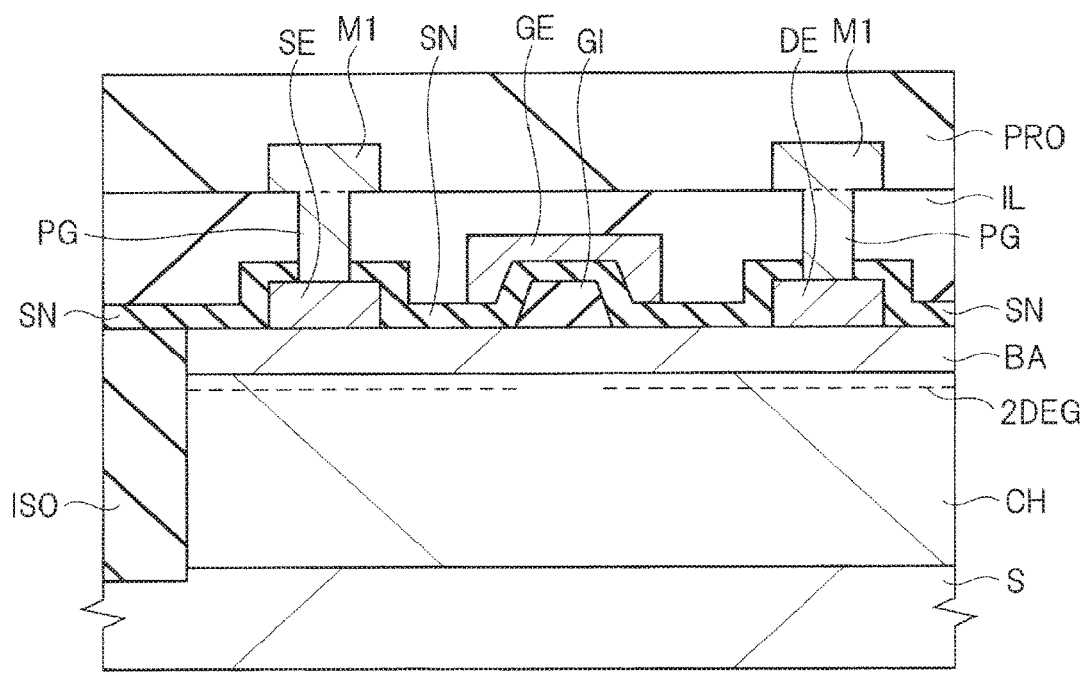
FIG. 12A is a sectional view illustrating a configuration of a semiconductor device according to Second Embodiment.
Figure 12B:
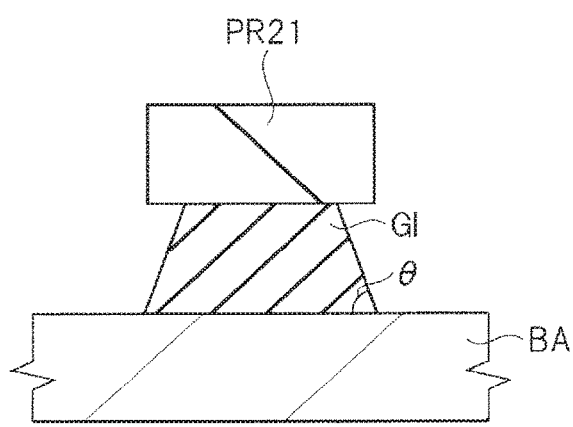
FIG. 12B is a sectional view illustrating a manufacturing step of the semiconductor device according to Second Embodiment.

FIG. 12A is a sectional view illustrating a configuration of a semiconductor device according to the present embodiment, and FIG. 12B is a sectional view illustrating a manufacturing step of the semiconductor device according to the embodiment.

As illustrated in FIG. 12A, the side surface of a gate insulating film GI may have a tapered shape. In other words, the sectional shape of the gate insulating film GI may have a trapezoidal shape whose lower side is longer. The configuration of the semiconductor device is the same as that of the semiconductor device according to First Embodiment (FIG. 1), except for the shape of the side surface of the gate insulating film GI, and hence description thereof will be omitted.

In the present embodiment, a short channel effect can be thus suppressed, in addition to the effects described in First Embodiment. That is, the ratio (aspect ratio) of the gate length to the distance between the gate electrode and the channel can be made small in the side surface of the gate insulating film GI by causing the side surface thereof to have a tapered shape, thereby allowing a short channel effect to be suppressed.

Subsequently, the manufacturing steps of the semiconductor device according to the present embodiment will be described. The manufacturing steps of the semiconductor device according to the embodiment are the same as those of the semiconductor device according to First Embodiment (FIG. 1), except for the step of forming the gate insulating film GI, and hence description thereof will be omitted.

As illustrated in FIG. 12B, after an aluminum oxide film is deposited to have a thickness of approximately 50 nm, over the barrier layer BA by using an ALD method, or the like, a photoresist film PR21 is formed over the aluminum oxide film, and the film 21 is caused to remain only in the region where the gate electrode is to be formed by exposing and developing the film PR21, and the gate insulating film (aluminum oxide) GI is etched by using the film PR21 as a mask.

In etching the gate insulating film GI, wet etching using, for example, a hydrofluoric acid-based etching solution is performed. Thus, the side surface of the gate insulating film GI can be formed into a tapered shape by performing wet etching. Herein, a photoresist film, or a hard mask such as a patterned silicon oxide film or silicon nitride film, may be used as the mask.

Herein, with reference to the tapered shape of the side surface of the gate insulating film GI, the angle θ between the side surface of the gate insulating film GI and the barrier layer BA is less than 90° (θ<90°). The angle θ is preferably within a range of 10° to 80°.

Third Embodiment

The gate electrode GE is arranged over the gate insulating film GI via the silicon nitride film SN in First and Second Embodiments; however, an opening may be provided in the silicon nitride film SN over the gate insulating film GI, so that the gate electrode GE may be arranged over the gate insulating film GI.

[Structure Description]

Figure 13:
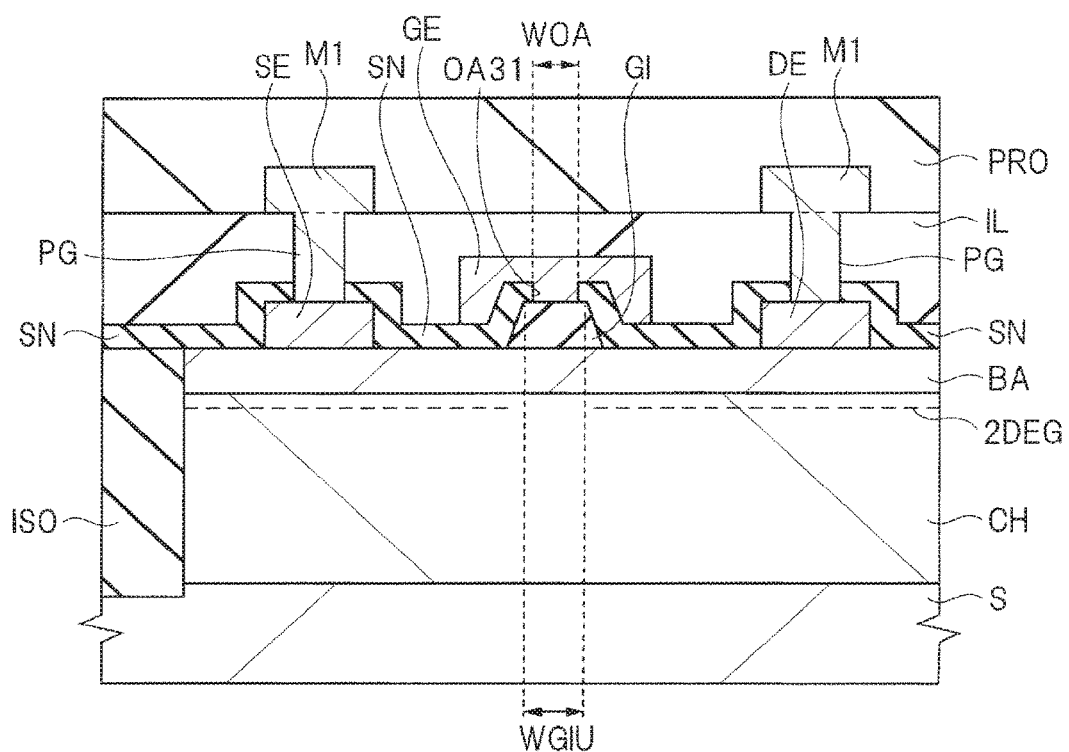
FIG. 13 is a sectional view illustrating a configuration of a semiconductor device according to Third Embodiment.

FIG. 13 is a sectional view illustrating a configuration of a semiconductor device according to the present embodiment. In the embodiment, the gate insulating film GI and the gate electrode GE are in contact with each other in an opening OA31 in the silicon nitride film SN, as illustrated in FIG. 13. The configuration of the semiconductor device is the same as that of the semiconductor device according to Second Embodiment (FIG. 2), except for the opening in the silicon nitride film SN, and hence description thereof will be omitted.

An influence by a fixed charge or a trap existing in the silicon nitride film SN can be reduced by thus removing the silicon nitride film SN over the gate insulating film GI in the present embodiment, in addition to the effects described in First and Second Embodiments. Thereby, the stability of a transistor operation can be further improved. The width of the opening OA31 is, for example, WOA. The width WOA of the opening is smaller than that of the gate insulating film GI (herein, the width WGIU of the upper side) (WOA<WGIU).

[Description of Manufacturing Method]

Subsequently, a manufacturing method of the semiconductor device according to the present embodiment will be described with reference to FIGS. 14 to 17, so that the configuration of the semiconductor device will be made clearer. FIGS. 14 to 17 are sectional views each illustrating a manufacturing step of the semiconductor device according to the embodiment.

Figure 14:
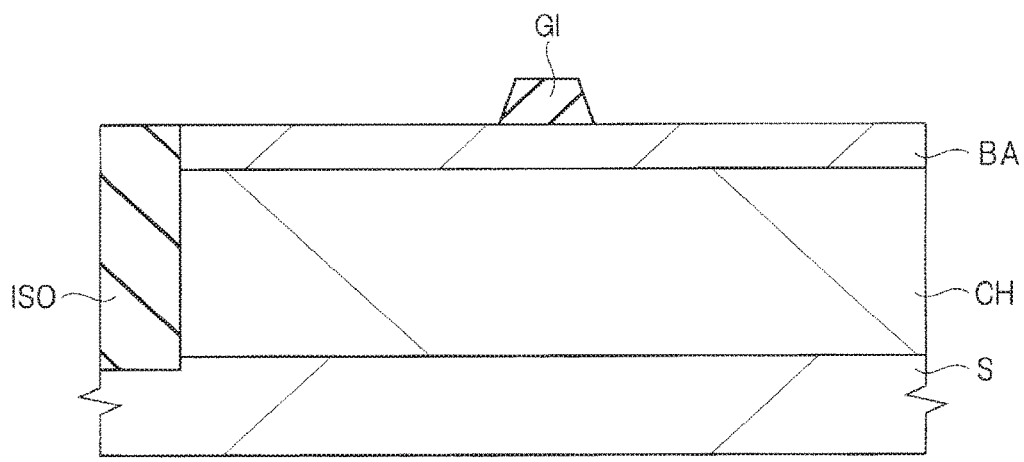
FIG. 14 is a sectional view illustrating a manufacturing step of the semiconductor device according to Third Embodiment.

As illustrated in FIG. 14, a channel layer CH and a barrier layer BA are sequentially formed over a substrate S. The channel layer CH and the barrier layer BA can be formed by using the materials described in First Embodiment and in the same way as that of First Embodiment. Subsequently, an element isolation region ISO is formed in the same way as that of First Embodiment.

Subsequently, a gate insulating film material is deposited in the same way as that of Second Embodiment (see FIG. 12B) and then etched by using a photoresist film as a mask. At the time, the side surface of a gate insulating film GI is caused to have a tapered shape by performing wet etching using, for example, a hydrofluoric acid-based etching solution, as described in Second Embodiment.

Figure 15:
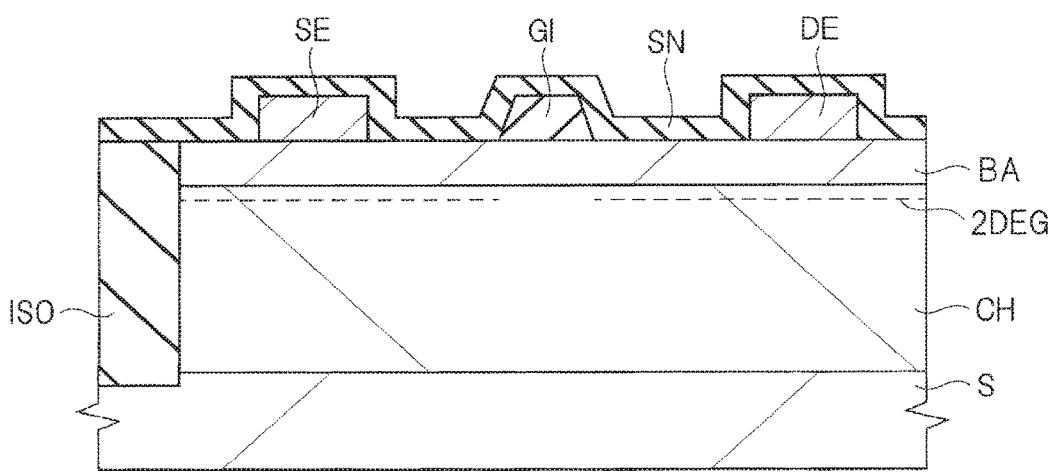
FIG. 15 is a sectional view illustrating a manufacturing step of the semiconductor device according to Third Embodiment, the manufacturing step following FIG. 14.

Subsequently, a source electrode SE and a drain electrode DE are formed over the barrier layer BA on both the sides of the gate insulating film GI, as illustrated in FIG. 15. The source electrode SE and the drain electrode DE can be formed by using a liftoff method, in the same way as that of First Embodiment. Subsequently, a silicon nitride film SN is formed over the barrier layer BA including the source electrode SE, the drain electrode DE, and the gate insulating film GI. For example, a silicon nitride film is formed in the same way as that of First Embodiment.

Figure 16:
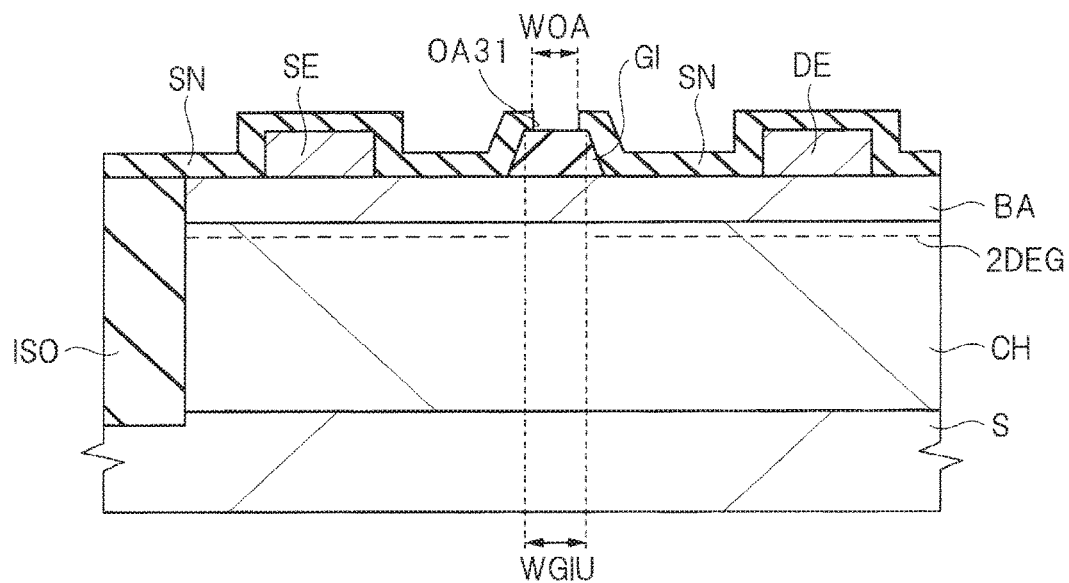
FIG. 16 is a sectional view illustrating a manufacturing step of the semiconductor device according to Third Embodiment, the manufacturing step following FIG. 15.

Subsequently, an opening OA31 is formed in the silicon nitride film SN, as illustrated in FIG. 16. For example, a photoresist film (not illustrated) is formed over the silicon nitride film SN, and then the photoresist film over a region where the gate electrode is to be formed is removed by exposing and developing the photoresist film. Subsequently, the silicon nitride film SN is etched by using the photoresist film as a mask. The planar shape of the opening OA31 is, for example, a line shape extending in a direction perpendicular to the plane of the paper (Y direction in FIG. 2). The width WOA of the opening is smaller than the width WGIU of the upper side of the gate insulating film GI. Thereafter, the photoresist film is removed.

Figure 17:
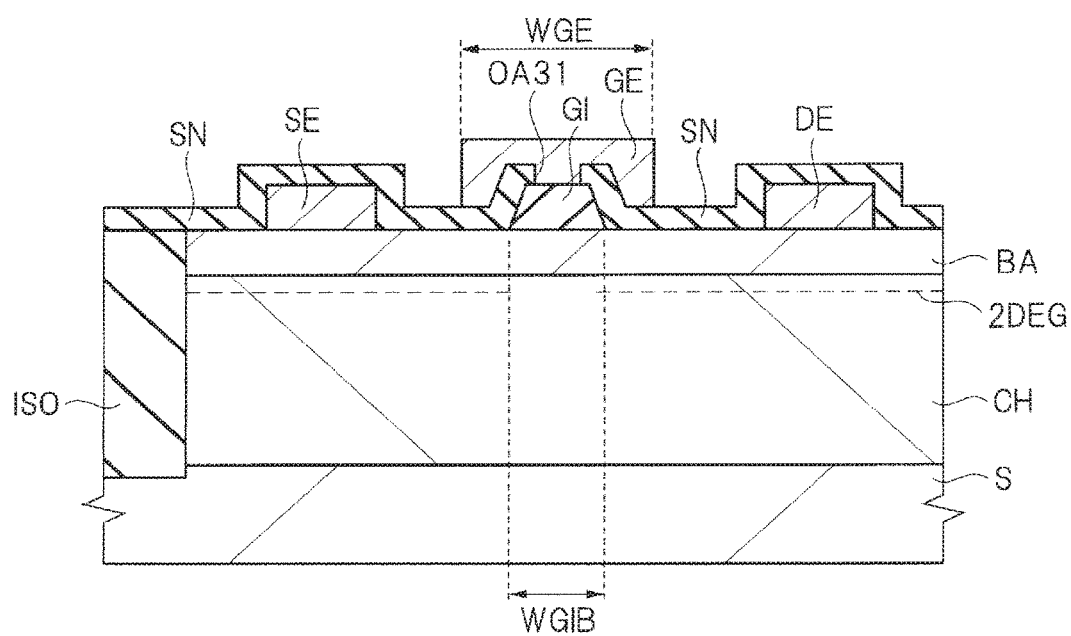
FIG. 17 is a sectional view illustrating a manufacturing step of the semiconductor device according to Third Embodiment, the manufacturing step following FIG. 16.

Subsequently, the gate electrode GE is formed over the opening OA31 in the silicon nitride film SN, as illustrated in FIG. 17. For example, a TiN (titanium nitride) film is deposited to have a thickness of approximately 200 nm, as a conductive film, over the silicon nitride film SN including the inside of the opening OA31 by using, for example, a sputtering method, or the like. Subsequently, the gate electrode GE is formed by patterning the TiN film in the same way as that of First Embodiment. The width of the gate electrode GE is, for example, WGE. The width WGE of the gate electrode GE is larger than the width WGIB of the lower side of the gate insulating film GI (WGE>WGIB). The width WGE of the gate electrode GE is also larger than the width WOA of the opening OA31 (WGE>WOA).

Subsequently, after an insulating film IL is formed over the gate electrode GE and the silicon nitride film SN, a plug PG and wiring M1 are formed, and further a protective film PRO is formed (see FIG. 13). The insulating film IL, the plug PG, the wiring M1, and the protective film PRO can be formed by using the materials described in First Embodiment and in the same way as that of First Embodiment.

With the aforementioned steps, the semiconductor device according to the present embodiment can be formed. Herein, the above steps are one example, and the semiconductor device according to the embodiment may be manufactured by the steps other than the above steps.

In the present embodiment, an opening is provided in the silicon nitride film SN over the gate insulating film GI whose side surface has a tapered shape described in Second Embodiment; however, an opening may be provided in the silicon nitride film SN over the gate insulating film GI according to First Embodiment.

Fourth Embodiment

In First Embodiment, the channel layer (also referred to as an electron transit layer) CH and the barrier layer BA are formed over the substrate S; however, the barrier layer BA may be omitted.

Figure 18:
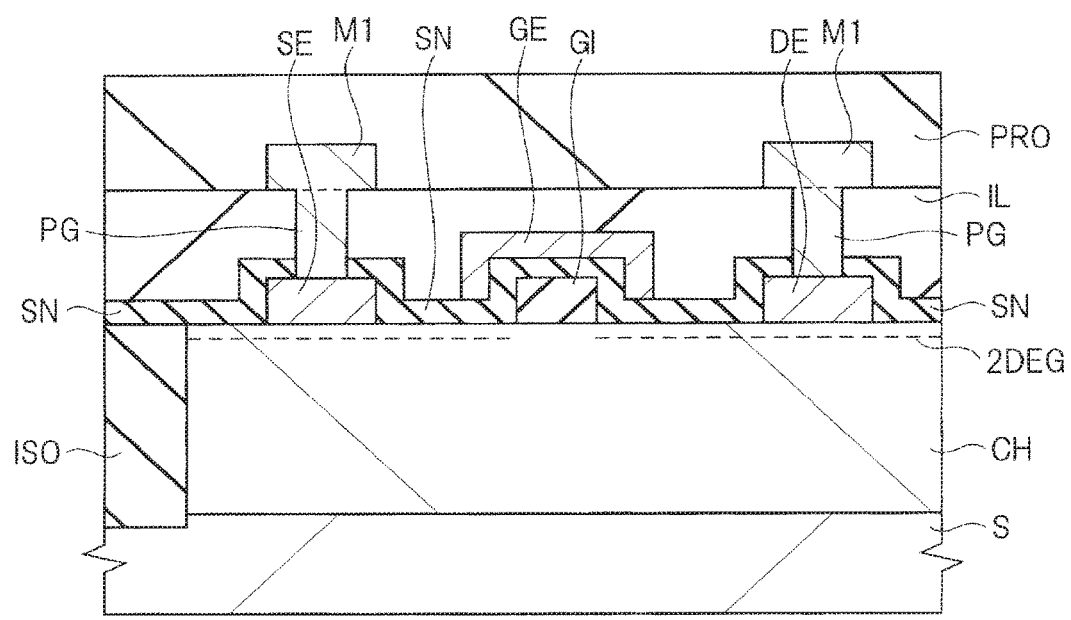
FIG. 18 is a sectional view illustrating a configuration of a semiconductor device according to Fourth Embodiment.

FIG. 18 is a sectional view illustrating a configuration of a semiconductor device according to the present embodiment. The semiconductor device according to the embodiment has a configuration in which a channel layer (also referred to as an electron transit layer) CH is formed over a substrate S and the barrier layer BA is omitted, as illustrated in FIG. 18.

Accordingly, a gate electrode GE formed above the channel layer CH via a gate insulating film GI, and a source electrode SE and a drain electrode DE that are formed over the channel layer CH on both the sides of the gate electrode GE, are provided in the present embodiment. In this case, the source electrode SE and the drain electrode DE are in ohmic contact with the channel layer CH. The configuration of the semiconductor device according to the embodiment is the same as that of the semiconductor device according to First Embodiment (FIG. 1), except for the omitted barrier layer BA, and hence description thereof will be omitted.

In the present embodiment, the silicon nitride film SN is thus formed over the channel layer CH located between the gate electrode GE and the source electrode SE and between the gate electrode GE and the drain electrode DE, and hence the surface potential of the channel layer CH is reduced by the silicon nitride film SN, thereby allowing two-dimensional electron gas (2DEG) to be formed. On the other hand, the concentration of the two-dimensional electron gas (2DEG) below the gate insulating film GI is lower than those of the two-dimensional electron gas (2DEG) located between the gate electrode GE and the source electrode SE and between the gate electrode GE and the drain electrode DE. Thereby, conduction and non-conduction can be controlled below the gate insulating film GI by the presence/absence of a channel, that is, by a potential applied to the gate electrode GE. Further, in a conduction state, the resistances between the gate electrode GE and the source electrode SE and between the gate electrode GE and the drain electrode DE can be reduced by the two-dimensional electron gas (2DEG). Thus, a normally-off operation can be performed. Furthermore, gate leakage in an OFF state can be suppressed by causing the gate electrode to have a so-called MIS structure. Still furthermore, an operating voltage can be easily adjusted (designed) by controlling the thickness of the gate insulating film.

Subsequently, the manufacturing steps of the semiconductor device according to the present embodiment will be described. The manufacturing steps of the semiconductor device according to the embodiment are the same as those of the semiconductor device according to First Embodiment (FIG. 1), except that the step of forming the barrier layer BA is omitted. Also in the manufacturing steps of the semiconductor device according to the embodiment, the sheet resistance of the channel layer CH after the silicon nitride film SN is formed (e.g., 1 MΩ/sq. or lower) is lower than that of the channel layer CH as is formed (e.g., 10 GS/sq. or higher).

Fifth Embodiment

In First Embodiment, the element isolation region ISO is formed; however, the silicon nitride film SN may be omitted in the element isolation region.

Figure 19:
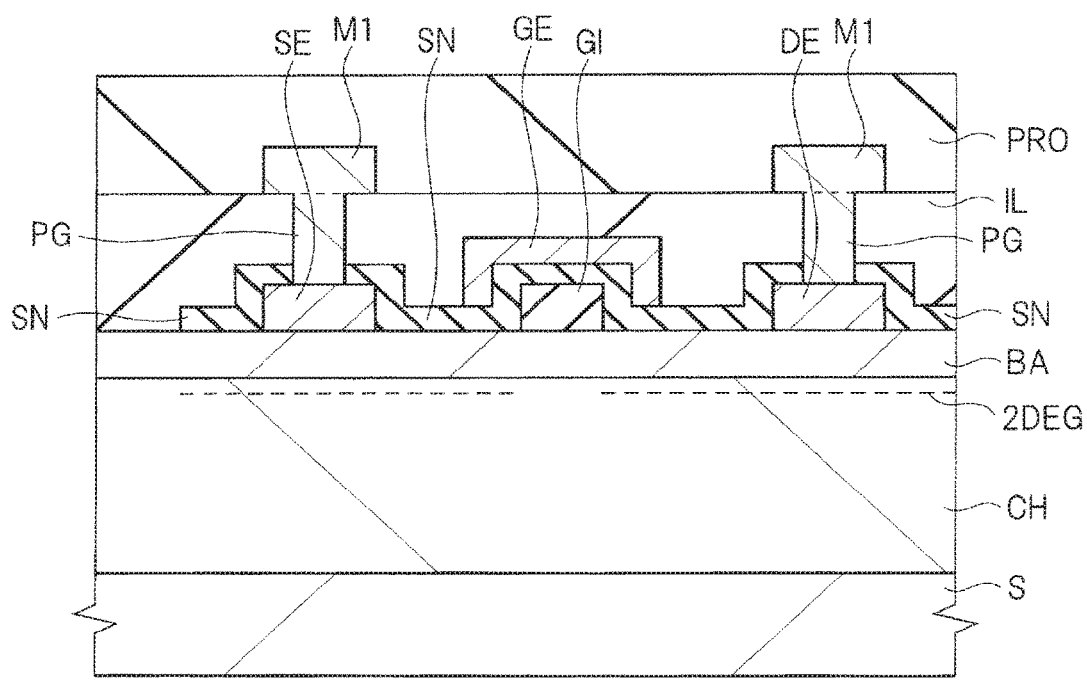
FIG. 19 is a sectional view illustrating a configuration of a semiconductor device according to Fifth Embodiment.

FIG. 19 is a sectional view illustrating a configuration of a semiconductor device according to the present embodiment. In the embodiment, the silicon nitride film SN in the element isolation region is omitted, as illustrated in FIG. 19. Accordingly, the two-dimensional electron gas 2DEG is not formed in the element isolation region in the embodiment. In other words, the concentration of the two-dimensional electron gas (2DEG) in the element isolation region is lower than those of the two-dimensional electron gas (2DEG) located between the gate electrode GE and the source electrode SE and between the gate electrode GE and the drain electrode DE. Thus, element isolation can also be achieved.

Subsequently, the manufacturing steps of the semiconductor device according to the present embodiment will be described. The manufacturing steps can be achieved in the following way: in the manufacturing steps described in First Embodiment, the step of forming the element isolation region ISO is omitted, and after the silicon nitride film SN is formed, the step of removing the silicon nitride film SN in the element isolation region is added. When an opening is provided in the silicon nitride film SN, it is better to remove the silicon nitride film SN in the element isolation region simultaneously with the removal of the silicon nitride film SN in the opening, as described in Third Embodiment.

The invention made by the present inventors has been specifically described above based on preferred embodiments; however, it is needless to say that the invention should not be limited to the preferred embodiments and various modifications may be made to the invention within a range not departing from the gist of the invention. For example, the side surface of the gate insulating film GI of Fourth Embodiment may have a tapered shape. Additionally, in Second Embodiment or Third Embodiment, the step of removing the silicon nitride film SN in the element isolation region may be adopted. Additionally, in Fourth Embodiment, the step of removing the silicon nitride film SN in the element isolation region may be adopted. Additionally, in Fourth Embodiment, a configuration in which the side surface of the gate insulating film GI has a tapered shape may be adopted, in addition to the step of removing the silicon nitride film SN in the element isolation region.

[Additional Remark 1]

A semiconductor device including the steps of:

(a) forming a first nitride semiconductor layer above a substrate;

(b) forming a gate insulating film over a first region of the first nitride semiconductor layer;

(c) forming a silicon nitride film over the first nitride semiconductor layer and the gate insulating film;

(d) forming a gate electrode above the gate insulating film via the silicon nitride film; and (e) forming both a first electrode above the first nitride semiconductor layer on one side of the gate electrode and a second electrode above the first nitride semiconductor layer on the other side of the gate electrode, in which the resistance of the first nitride semiconductor layer, after the above step (c), is lower than that of the first nitride semiconductor layer, in the above step (a).

What is claimed is:

1. A semiconductor device comprising:
   a first nitride semiconductor layer formed above a substrate;
   a gate electrode arranged over the first nitride semiconductor layer via a gate insulating film;
   a first electrode and a second electrode that are formed above the first nitride semiconductor layer on both sides of the gate electrode, respectively;
   a silicon nitride film, including:
   a first portion of the silicon nitride film formed on the first nitride semiconductor layer between the first electrode and the gate electrode;
   a second portion of the silicon nitride film formed on the first nitride semiconductor layer between the second electrode and the gate electrode; and
   a third portion of the silicon nitride film formed between the gate electrode and the gate insulating film,
   wherein a concentration of two-dimensional electron gas in the first nitride semiconductor layer below the first portion of the silicon nitride film and the second portion of the silicon nitride film is higher than that of the two-dimensional electron gas in the first nitride semiconductor layer below the gate insulating film.

2. The semiconductor device according to claim 1,
wherein the silicon nitride film includes portions respectively above the first and second electrodes.

3. The semiconductor device according to claim 1,
wherein the third portion of the silicon nitride film protrudes upward into the gate electrode.

4. The semiconductor device according to claim 1,
wherein the gate insulating film does not include silicon nitride.

5. The semiconductor device according to claim 1,
wherein third portion of the silicon nitride film includes an opening where the gate electrode is in contact with the gate insulating film.

6. A semiconductor device comprising:
a first nitride semiconductor layer formed above a substrate;
a gate electrode arranged over the first nitride semiconductor layer via a gate insulating film;
a first electrode and a second electrode that are formed above the first nitride semiconductor layer on both sides of the gate electrode, respectively;
a silicon nitride film, including:
a first portion of the silicon nitride film formed on the first nitride semiconductor layer between the first electrode and the gate electrode;
a second portion of the silicon nitride film formed on the first nitride semiconductor layer between the second electrode and the gate electrode; and
a third portion of the silicon nitride film formed between the gate electrode and the gate insulating film,
wherein the third portion of the silicon nitride film protrudes upward into the gate electrode.

7. The semiconductor device according to claim 6,
wherein the silicon nitride film includes portions respectively above the first and second electrodes.

8. The semiconductor device according to claim 6,
wherein the gate insulating film does not include silicon nitride.

9. The semiconductor device according to claim 6,
wherein third portion of the silicon nitride film includes an opening where the gate electrode is in contact with the gate insulating film.

\* \* \* \* \*